United States Patent [19]
Dixon et al.

[11] Patent Number: 5,012,136
[45] Date of Patent: Apr. 30, 1991

[54] HIGH SPEED ECL TO CMOS TRANSLATOR HAVING REDUCED POWER CONSUMPTION

[75] Inventors: Robert Dixon, Tempe; Golnaz Kaveh, Chandler; Walter Seelbach, Fountain Hills, all of Ariz.

[73] Assignee: Motorola, Inc., Schaumburg, Ill.

[21] Appl. No.: 445,529

[22] Filed: Dec. 4, 1989

[51] Int. Cl.$^5$ .................... H03K 19/092; H03K 19/08
[52] U.S. Cl. ..................... 307/475; 307/443; 307/296.6
[58] Field of Search ............... 307/475, 443, 296.6, 307/454, 547, 551, 553

[56] References Cited

U.S. PATENT DOCUMENTS

| | | | |
|---|---|---|---|
| 4,456,838 | 6/1984 | Taguchi et al. | 307/296.6 |
| 4,603,268 | 7/1986 | Davis | 307/551 |
| 4,642,483 | 2/1987 | Tomita | 307/296.6 |
| 4,644,194 | 2/1987 | Birrittelca et al. | 307/475 |
| 4,825,108 | 4/1989 | Burton et al. | 307/551 |

Primary Examiner—David Hudspeth
Assistant Examiner—Andrew Sanders
Attorney, Agent, or Firm—Michael D. Bingham; Robert D. Atkins

[57] ABSTRACT

A high speed voltage translator provides a CMOS output signal in response to an ECL input signal which is applied to an input stage coupled between first and second power supply conductors wherein the potential developed at the output of the input stage is independent of variations in the power supply voltage. The translating stage is coupled between said first and second power supply conductors and is responsive to the potential developed at the output of the input stage for conducting a predetermined current therethrough. A feedback signal proportional to the magnitude of the predetermined current flowing through the translating stage is generated to control the potential developed at the output of the input stage so as to maintain the predetermined current at a low value to reduce the power consumption of the voltage translator.

13 Claims, 1 Drawing Sheet

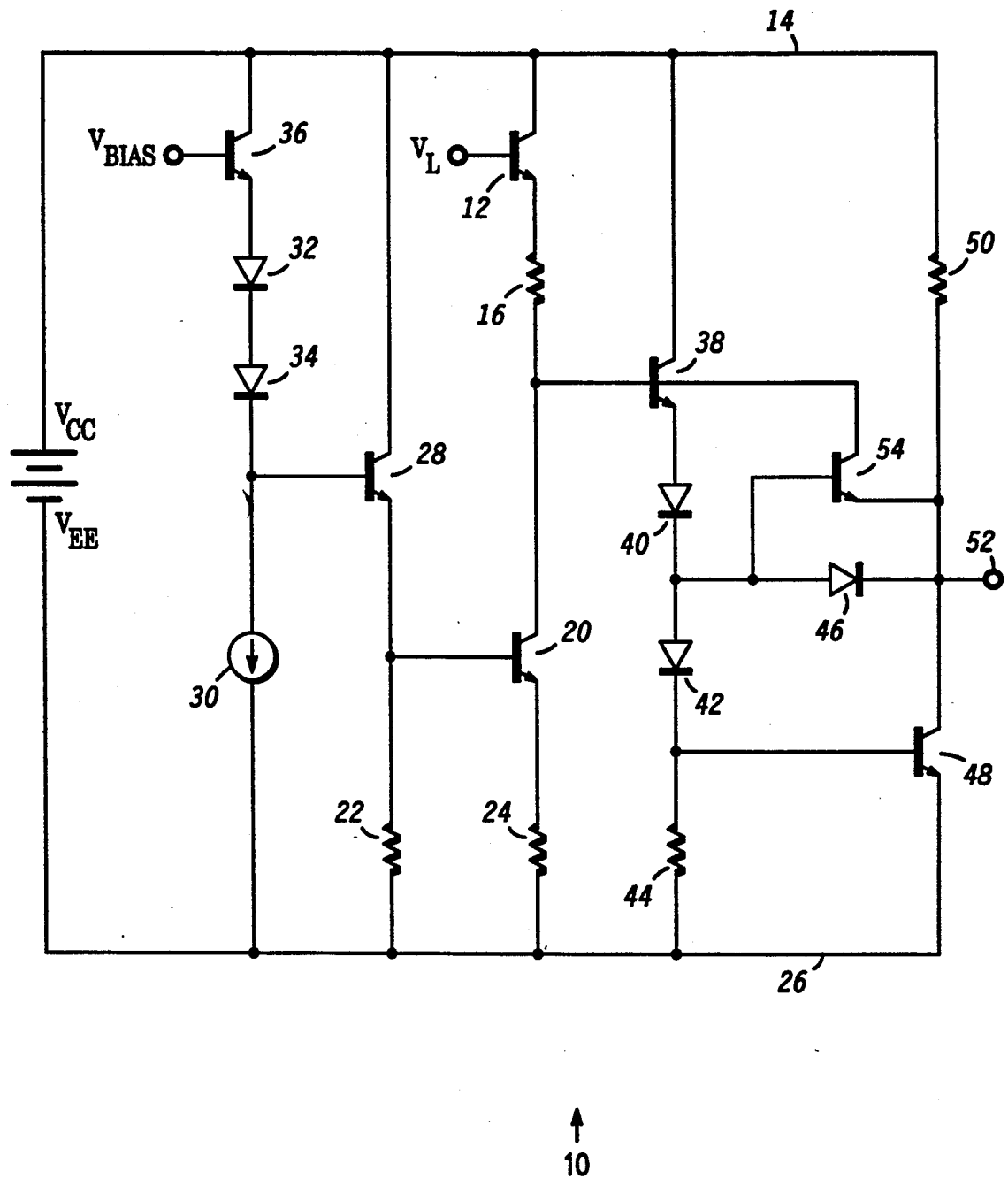

HIGH SPEED ECL TO CMOS TRANSLATOR HAVING REDUCED POWER CONSUMPTION

BACKGROUND OF THE INVENTION

The present invention relates in general to voltage translators, and more particularly, to an Emitter Coupled Logic (ECL) to Complimentary Metal Oxide Semiconductor (CMOS) voltage translator combining high speed operation and reduced power consumption.

It is well known that many of today's complex systems mix and match integrated circuits (ICs) of different logic families to accomplish a series of interrelated functions. In one example, signals produced in one logic family, ECL, are translated to levels compatible with another logic family, CMOS, for further processing. One known voltage translator, disclosed in U.S. Pat. No. 4,644,194, comprises an emitter-follower NPN transistor having its emitter coupled to the base of a second transistor through a first resistor. The collector-emitter conduction path of the second transistor is coupled between an upper power supply conductor operating at $V_{CC}$ and a lower power supply conductor operating at $V_{EE}$ through a pair of serially coupled diodes and a second resistor for translating the ECL input signal, which is typically referenced to the upper $V_{CC}$ rail, to a potential across the second resistor referenced to the lower $V_{EE}$ rail. The base of a third transistor is responsive to the potential developed across the second resistor for providing the output signal at the collector thereof. In addition, a regulation circuit is coupled to the base of the second transistor to compensate for changes in $V_{EE}$ such that the output signal is independent of power supply variation.

When a logic high ECL input signal is applied at the base of the emitter-follower transistor, collector current flows through the first resistor and turns on the second transistor to establish a current flowing through its collector-emitter conduction path. The impedance between the emitter of the second transistor and power supply conductor $V_{EE}$ is made very low (three PN junctions) for providing high speed operation, but the low impedance also permits excessive current to flow through the translating conduction path. The large current tends to saturate the third transistor and generate excessive power dissipation, both of which are undesirable.

Hence, there is a need for an improved ECL to CMOS translator for combining the features of high speed operation and reduced power consumption with minimal additional components.

SUMMARY OF THE INVENTION

Accordingly, it is an objective of the present invention to provide an improved ECL to CMOS voltage translator.

A further objective of the present invention is to provide an improved ECL to CMOS voltage translator for limiting the current flowing through the level translating components to reduce the power consumption.

Another objective of the present invention is to provide an improved ECL to CMOS translator requiring a minimal number of additional components to achieve the reduction in power consumption.

In accordance with the above and other objectives there is provided an improved ECL to CMOS translator responsive to an input logic signal for providing an output signal of a predetermined logic level comprising, first circuit coupled between first and second power supply conductors for developing a first potential in response to the input logic signal wherein the first potential is independent of variations in the supply voltage of the first and second power supply conductors; a second circuit for conducting current between the first and second power supply conductor in response to the first potential; a third circuit for developing a feedback signal proportional to the magnitude of the current flowing through the second circuit; and a fourth circuit for applying the feedback signal to the first means stage for controlling the magnitude of the first potential to limit the magnitude of the current flowing through the second circuit to a predetermined value.

BRIEF DESCRIPTION OF THE DRAWINGS

The sole FIGURE is a schematic diagram illustrating the preferred embodiment of the present invention.

DETAILED DESCRIPTION OF THE PREFERRED EMBODIMENT

Referring to the sole figure, voltage translator 10 comprises NPN transistor 12 having a base coupled for receiving an ECL input signal, and a collector coupled to power supply conductor 14, typically operating at ground potential. The emitter of transistor 12 is coupled through resistor 16 to the collector of transistor 20. The base and emitter of transistor 20 are then coupled through resistors 22 and 24, respectively, to power supply conductor 26 which typically operates at a negative supply voltage, $V_{EE}$, such as $-5.2$ volts. The base of transistor 20 is also coupled to the emitter of transistor 28, the latter of which includes a collector coupled to power supply conductor 14 and a base coupled through current supply 30 to power supply conductor 26. Diodes 32 and 34 are serially coupled between the base of transistor 28 and the emitter of transistor 36. The collector of transistor 36 is coupled to power supply conductor 14, while the base of transistor 36 is responsive to an applied bias voltage, $V_{BIAS}$, the latter of which is typically established at the mid-range of the ECL input signal; zero volts for a logic high and $-0.8$ volts for a logic low.

The aforedescribed circuitry operates as a regulator wherein variation in the power supply $V_{EE}$ is absorbed in the potential across resistor 24. For the purpose of this discussion, the base currents are considered negligible. Voltage $V_{BIAS}(-0.4$ volts with respect to $V_{CC})$ is applied to the base of transistor 36 enabling a current to flow through diodes 32 and 34 into current supply 30. The potential developed at the base of transistor 28 is three PN junction potentials (base-emitter of transistor 36 and diodes 32 and 34) below voltage $V_{BIAS}$; a sufficient level to turn on transistors 28 and 20 and establish a potential across resistor 24, $V_{24}$, equal to:

$$V_{24} = V_{EE} - V_{BIAS} - V_{36}V_{32} - V_{34} - V_{28} - V_{20} \qquad (1)$$

where:
- $V_{36}$ is the base-emitter junction potential ($V_{be}$) of transistor
- $V_{32}$ is the potential across diode 32
- $V_{34}$ is the potential across diode 34
- $V_{28}$ is the $V_{be}$ of transistor 28
- $V_{20}$ is the $V_{be}$ of transistor 20

The potentials across the base-emitter junctions of transistors 20, 28 and 36 and diodes 32 and 34 at a given temperature are substantially constant since each varies logarithmically with current. Thus, variation in voltage $V_{EE}$ is reflected in the voltage across resistor 24 thereby changing the current flowing therethrough. This same current flows through resistor 16 producing the identical variation in the voltage at the collector of transistor 20 as observed in power supply conductor 26. Hence, the potential developed at the collector of transistor 20 is constant with respect to power supply voltage $V_{EE}$.

The collector of transistor 20 provides the input signal to the translating stage of voltage translator 10 comprising transistor 38, diodes 40 and 42 and resistor 44. The collector and emitter of transistor 38 are coupled to power supply conductors 14 and 26, respectively, the latter path including serially coupled diodes 40 and 42 and resistor 44. The cathodes of diodes 40 and 42 are coupled to the anode of diode 46 and to the base of transistor 48, respectively. The collector of transistor 48 is coupled to the cathode of diode 46 and to power supply conductors 14 through resistor 50, while the emitter of the same is coupled to power supply conductor 26. The output of voltage translator circuit 10 is provided at output 52 that is the collector of transistor 48.

Transistor 12 is an emitter-follower whereby the potential developed at the emitter follows the potential applied to the base. Assuming that a logic high ECL input signal, $V_L$ (0 volts with respect to $V_{CC}$) is applied to the base of transistor 12, the potential at the base of transistor 38 as well as the potentials at the cathodes of diodes 40 and 42 follow the input signal although shifted in voltage by the potentials across the base-emitter junction of transistor 38 and diodes 40 and 42, respectively, developing a sufficient potential across resistor 44 to turn on transistor 48. The voltage at output 52, $V_{52}$, is then given by:

$$V_{52} = V_{48} + V_{42} - V_{46} \qquad (2)$$

where:
$V_{48}$ is the $V_{be}$ of transistor 48
$V_{42}$ is the potential across diode 42
$V_{46}$ is the potential across diode 46

Since voltage $V_{48}$, $V_{42}$ and $V_{46}$ are essentially equal, voltage $V_{52}$ is clamped to one diode potential above power supply voltage $V_{EE}$. Although the addition of clamping diode 46 limits the voltage developed at the collector of transistor 48 to avoid saturation, the current flowing through the translating stage continues to conduct through a low impedance path to power supply conductor 26. To limit the current flowing in transistor 38 and diodes 40 and 42, transistor 54 is provided including a base coupled to the anode of diode 46, and a collector and an emitter coupled to the base of transistor 38 and the collector of transistor 48, respectively. A predetermined current flows through the collector-emitter conduction path of transistor 38 and establishes a potential at the anode of diode 42 equal to potential across diode 42 plus the voltage across resistor 44 with respect to power supply voltage $V_{EE}$. The current flowing through diode 46, as a function of the voltage developed at the anode of diode 42, is mirrored in the collector-emitter conduction path of transistor 54 such that the voltage developed at the base of transistor 38 maintains the predetermined current flowing therethrough. It is the values of resistors 16 and 44 that determine the magnitude of the predetermined current flowing through the translating stage; the greater the values of these resistors, the smaller the current flowing. However, excessive values of resistors 16 and 44 tend to slow the speed of voltage translator 10; typical value for the speed/power trade off is 3000 ohms for both. Hence, the voltage developed at the base of transistor 38 is regulated by the collector current flowing through transistor 54 to maintain a predetermined current flowing through the translating stage proportional to the value of resistors 16 and 44. If the potential at the base of transistor 38 should attempt to increase, the resulting increase in current flowing through transistor 38 would develop a larger potential across resistor 44 which in turn increases the potential at the base of transistor 54 causing the latter to conducting additional collector current thereby reducing the voltage at the base of transistor 38 to reestablish the predetermined current flowing through the translating stage.

For the case of a logic low ECL input signal ($-0.8$ volts with respect to $V_{CC}$) applied to the base of transistor 12, the potentials developed at the emitter of transistor 38 and the cathodes of diodes 40 and 42 again follow the input signal reducing the potential developed across resistor 44 to an insufficient level to turn on transistor 48 and allowing the voltage at output 52 to rise toward $V_{CC}$ via resistor 50. The current flowing through the translating stage is determined by the value of resistor 44. Hence, the total translator power dissipation for a logic low input signal is determined by resistor 44, while the total translator power dissipation for a logic high input signal is determined by the values of resistors 16, 44 and 50.

Hence what has been provided is a novel voltage translator responsive to an ECL input signal for providing a CMOS output signal combining the features of high speed and reduced current flowing through the translating stage to reduce power consumption wherein all of the above are provided with minimal additional components.

We claim:

1. A method of limiting the power consumption of a voltage translator, comprising the steps of:
    applying an input logic signal at the input of an input circuit coupled between first and second power supply conductors;
    developing a first potential at the output of said input circuit in response to said input logic signal, said first potential operating substantially independent of variations in the supply voltage of said first and second power supply conductors;
    conducting a predetermined current through a translating circuit coupled between said first and second power supply conductor in response to said first potential;
    developing a feedback signal proportional to the magnitude of said predetermined current flowing through said translating circuit; and
    applying said feedback signal to said output of said input stage for controlling the magnitude of said first potential to maintain the magnitude of said predetermined current flowing through said translating circuit at a sufficiently low level to reduce the power consumption thereof.

2. A circuit responsive to an input logic signal for providing an output signal having predetermined logic levels at an output, comprising:
    first means coupled between first and second power supply conductors for developing a first potential at a first node, said first potential having first and second states in response to first and second states of the input logic signal and operating substantially independent of variations in the supply voltage of said first and second power supply conductors;

second means coupled to said first node of said first means for conducting a first current between said first and second power supply conductors and developing a second potential at a second node in response to said first state of said first potential;

third means coupled for receiving said second potential developed at said second node of said second means and providing the output signal at the output of the circuit; and fourth means coupled between the output of the circuit and said first node of said first means for developing a feedback signal proportional to the magnitude of said first current flowing through said second means and applying said feedback signal to said first node for controlling the magnitude of said first state of said first potential to limit the magnitude of said first current flowing through said second means to a predetermined value.

3. The circuit of claim 2 wherein said second means comprises:

a first transistor having an emitter, a base and a collector, said base being responsive to said first potential developed at said first node of said first means, said collector being coupled to a first source of operating potential;

first diode means having an anode coupled to said emitter of said first transistor and having a cathode;

second diode means having an anode coupled to said cathode of said first diode means and having a cathode; and a first resistor coupled between said cathode of said second diode means and a second source of operating potential for developing said second potential.

4. The circuit of claim 2 wherein said fourth means comprises:

third diode means having an anode coupled to said cathode of said first diode means and having a cathode coupled to said collector of said second transistor; and a third transistor having an emitter, a base and a collector, said base being coupled to said anode of said third diode means, said emitter being coupled to said collector of said second transistor, said collector being coupled to said base of said first transistor.

5. The circuit of claim 4 wherein said first means comprises:

a fourth transistor having an emitter, a base and a collector, said base being responsive to the input logic signal, said collector being coupled to said first source of operating potential;

a third resistor coupled between said emitter of said fourth transistor and said base of said first transistor;

a fifth transistor having an emitter, a base and a collector coupled to said base of said first transistor;

a fourth resistor coupled between said emitter of said fifth transistor and said second source of operating potential;

a fifth resistor coupled between said base of said fifth transistor and said second source of operating potential;

current supply means having an output for providing a current of a predetermined magnitude;

a sixth transistor having an emitter, a base and a collector, said base being coupled to said output of said current supply means, said collector being coupled to said first source of operating potential, said emitter being coupled to said base of said fifth transistor;

fourth diode means having a cathode coupled to said base of said sixth transistor and having an anode;

fifth diode means having a cathode coupled to said anode of said fourth diode means and having an anode; and a seventh transistor having an emitter, a collector and a base at which a bias potential is applied, said collector being coupled to said first source of operating potential, said emitter being coupled to said anode of said fifth diode means.

6. A voltage translator responsive to an input logic signal for providing an output signal having predetermined logic levels at an output, comprising an input stage having an input coupled for receiving the input logic signal and an output for providing a first potential; a first transistor having a base coupled for receiving the first potential, a collector coupled to a first source of operating potential, and having an emitter; first diode means having an anode coupled to the emitter of the first transistor and having a cathode; second diode means having an anode coupled to the cathode of the first diode means and having a cathode; a first resistor coupled between the cathode of the second diode means and a second source of operating potential for providing a second potential; a second transistor having a base coupled for receiving the second potential, an emitter coupled to the second source of operating potential, and having a collector coupled to the output of the voltage translator for providing the output signal; and a second resistor coupled between the collector of the second transistor and the first source of operating potential, wherein the improvement comprises:

third diode means having an anode coupled to the cathode of the first diode means and having a cathode coupled to the collector of the second transistor; and a third transistor having an emitter, a base and a collector, said base being coupled to said anode of said third diode means, said emitter being coupled to the collector of the second transistor, said collector being coupled to the base of the first transistor.

7. The voltage translator of claim 6 wherein the input stage comprises:

a fourth transistor having an emitter, a base and a collector, said base being coupled to the input of the input stage, said collector being coupled to the first source of operating potential;

a third resistor coupled between said emitter of said fourth transistor and the base of the first transistor; and a regulating circuit having an output coupled to the base of the first transistor and responsive to a bias potential for maintaining a constant level for a first state of the first potential developed at the base of the first transistor with respect to the second operating potential.

8. The voltage translator of claim 7 wherein said regulating circuit comprises:

a fifth transistor having an emitter, a base and a collector coupled to the base of the first transistor;

a fourth resistor coupled between said emitter of said fifth transistor and the second source of operating potential;

a fifth resistor coupled between said base of said fifth transistor and the second source of operating potential;

current supply means having an output for providing a current of a predetermined magnitude; and a sixth transistor having an emitter, a base and a collector, said base being coupled to said output of said current supply means, said collector being coupled to the first source of operating potential, said emitter being coupled to said base of said fifth transistor.

9. The voltage translator of claim 8 wherein said regulating circuit further comprises:

fourth diode means having a cathode coupled to said base of said sixth transistor and having an anode;

fifth diode means having a cathode coupled to said anode of said fourth diode means and having an anode; and a seventh transistor having an emitter, a collector and a base at which a bias potential is applied, said collector being coupled to the first source of operating potential, said emitter being coupled to said anode of said fifth diode means.

10. A voltage translator responsive to an input logic signal for providing an output signal having predetermined logic levels at an output, comprising:

an input stage having an input coupled for receiving the input logic signal and providing a first potential at an output;

a first transistor having an emitter, a base and a collector, said base being coupled for receiving said first potential, said collector being coupled to a first source of operating potential;

first diode means having an anode coupled to said emitter of said first transistor and having a cathode;

second diode means having an anode coupled to said cathode of said first diode means and having a cathode;

a first resistor coupled between said cathode of said second diode means and a second source of operating potential for developing a second potential;

a second transistor having an emitter, a base and a collector, said base being coupled for receiving said second potential, said emitter being coupled to said second source of operating potential, said collector being coupled to the output of the voltage translator for providing the output signal;

a second resistor coupled between said collector of said second transistor and said first source of operating potential;

third diode means having an anode coupled to said cathode of said first diode means and having a cathode coupled to said collector of said second transistor; and a third transistor having an emitter, a base and a collector, said base being coupled to said anode of said third diode means, said emitter being coupled to said collector of said second transistor, said collector being coupled to said base of said first transistor.

11. The voltage translator of claim 10 wherein said input stage comprises:

a fourth transistor having an emitter, a base and a collector, said base being coupled to said input of said input stage, said collector being coupled to said first source of operating potential;

a third resistor coupled between said emitter of said fourth transistor and said base of said first transistor;

a fifth transistor having an emitter, a base and a collector coupled to said base of said first transistor;

a fourth resistor coupled between said emitter of said fifth transistor and said second source of operating potential; and a fifth resistor coupled between said base of said fifth transistor and said second source of operating potential.

12. The voltage translator of claim 11 wherein said input stage further comprises:

current supply means having an output for providing a current of a predetermined magnitude;

a sixth transistor having an emitter, a base and a collector, said base being coupled to said output of said current supply means, said collector being coupled to said first source of operating potential, said emitter being coupled to said base of said fifth transistor;

fourth diode means having a cathode coupled to said base of said sixth transistor and having an anode;

fifth diode means having a cathode coupled to said anode of said fourth diode means and having an anode; and a seventh transistor having an emitter, a collector and a base at which a bias potential is applied, said collector being coupled to said first source of operating potential, said emitter being coupled to said anode of said fifth diode means.

13. The circuit of claim 3 wherein said third means comprises:

a second transistor having an emitter, a base and a collector, said base being coupled for receiving said second potential, said emitter being coupled to said second source of operating potential, said collector being coupled to the output of the circuit; and a second resistor coupled between said collector of said second transistor and said first source of operating potential.

* * * * *